United States Patent [19]

McKinnon et al.

[11] Patent Number: 5,275,163
[45] Date of Patent: Jan. 4, 1994

[54] MAGNETIC RESONANCE IMAGING METHOD AND DEVICE FOR MONITORING MOTION OF A PART OF AN OBJECT

[75] Inventors: Graeme McKinnon; Stefan Fischer, both of Zürich; Peter Boesiger, Ennetbaden, all of Switzerland

[73] Assignee: U.S. Philips Corporation, New York, N.Y.

[21] Appl. No.: 859,749

[22] Filed: Mar. 30, 1992

[30] Foreign Application Priority Data

Apr. 2, 1991 [EP] European Pat. Off. ........ 91200762.2

[51] Int. Cl.⁵ .............................................. A61B 5/055
[52] U.S. Cl. .................................. 128/653.2; 128/708; 324/309
[58] Field of Search ............................ 128/653.2, 708; 324/309, 307

[56] References Cited

PUBLICATIONS

J. Frahm et al., "Rapid NMR Imaging Using Stimulated Echoes", Journal of Magnetic Resonance, vol. 65, (1985) pp. 130–135.
L. Axel et al., "MR Imaging of Motion with Spatial Modulation of Magnetization", Radiology 1989, vol. 171, No. 3, pp. 841–845.
E. McVeigh et al., "A Rapid Starburst Pulse Sequence for Cardiac Tagging", Book of Abstracts, SMRM 1989, Amsterdam, p. 23.
E. A. Zerhouni et al., "Human Heart: Tagging with MR Imaging—A Method of Non-invasive Assessment of Myocardial Motion", Radiology, Oct. 1988, pp. 59–63.

Primary Examiner—Ruth S. Smith
Attorney, Agent, or Firm—Jack D. Slobod

[57] ABSTRACT

A magnetic resonance imaging method and device include a processor and a demodulator including a signal sampling device which provide automatic quantitative motion evaluation of a part of an object. Pulse and gradient sequences (tsq) are applied in pairs with spatially differing tagging patterns, images corresponding to the pairs being subtracted so as to form a tagged image. The motion is monitored by scanning of the tagging pattern in the tagged image which permits improved motion evaluation.

24 Claims, 2 Drawing Sheets

MAGNETIC RESONANCE IMAGING METHOD AND DEVICE FOR MONITORING MOTION OF A PART OF AN OBJECT

BACKGROUND OF THE INVENTION

1. Field of the Invention

The present invention relates to a magnetic resonance imaging method for monitoring motion of a part of an object to be imaged by application of pulse and gradient sequences to the object, which sequences comprise a tagging section for producing a tagging pattern and an imaging section for producing magnetic resonance signals in the part of the object, the resonance signals being used for forming at least one image of the object. Such tagging patterns can be used in connection with cardiac imaging as so-called myocardial tagging grids to evaluate heart motion in multi heart phase imaging, but can also be used for other purposes such as radiation therapy port planning of a liver. In the latter case the tagging is quasi static.

The present invention further relates to a magnetic resonance imaging device for monitoring motion of a part of an object, which imaging device comprises means for generating a stationary homogeneous magnetic field, means for radiating radio frequency pulses to the object which is placed in the stationary field, gradient generating means for generating magnetic gradient fields which are superimposed upon the stationary field, and processing means which are arranged for applying pulse and gradient sequences to the object under the control of control means, the sequences comprising a tagging section and an imaging section, and which imaging device further comprises receiving means and sampling means for receiving and sampling of magnetic resonance signals generated by the sequences in at least a part of the object, the processing means being arranged for processing sampled resonance signals into at least one image.

Of interest is commonly owned copending application Ser. No. 07/860,620 entitled "Magnetic Resonance Imaging Method and Device for Monitoring Motion of a part of an Object Based on Stimulated Echoes" filed concurrently herewith by the present inventors.

2. Description of the Prior Art

A method and device of this kind are known from the article "MR Imaging of Motion with Spatial Modulation of Magnetization", L. Axel et al., Radiology, Volume 171, No. 3, pp. 841-845. For direct imaging of motion of the myocardium a multi heart phase imaging sequence is preceded by a pre-imaging so-called tagging sequence in order to obtain a line or grid reference pattern in the image. The tagging sequence is applied upon detection of the R-wave of an electrocardiogram. The multi heart phase imaging sequence produces magnetic resonance signals in a slice of the heart at different time intervals from the R-wave. Successive magnetic resonance images to be displayed visualize heart motion such as contraction and rotation, the tagging grid in the myocardium being displaced with respect to the chest wall tagging grid in successive heart images of the same slice. The tagging section of the imaging sequence comprises a radio frequency pulse to produce transverse magnetization, a magnetic field gradient to "wrap" the phase along the direction of the gradient and a further radio frequency pulse to mix the modulated transverse magnetization with the longitudinal magnetization. The resulting images show periodic stripes due to the modulation. A second set of modulation bands, for example, in a direction orthogonal to the first, can be produced by following the further radio frequency pulse with a further magnetic field gradient in an appropriate direction and then with a still further radio frequency pulse. Different tagging sections have also been described, e.g. for obtaining a radial tagging pattern, in "A Rapid Starburst Pulse Sequence for Cardiac Tagging", E. McVeigh et al., Book of Abstracts, SMRM 1989, Amsterdam, page 23, or in "Human Heart: Tagging with MR Imaging - A method for Noninvasive Assessment of Myocardial Motion", E.A. Zerhouni et al., Radiology, October 1988, pp. 59-63.

In all these methods it is difficult or not at all possible to evaluate the motion quantitatively, especially automatic evaluation using computer means, due to a relatively poor grid contrast. For images obtained at later stages of the heart cycle the contrast is reduced due to longitudinal relaxation effects. Not only does the grid pattern decay with longitudinal relaxation, but the image intensity becomes increasingly dominated by magnetization which has returned to its relaxed state, and which hence again becomes available for imaging. This relaxed magnetization which is devoid of the grid pattern, and which is thus not useful as far as the tagging is concerned, is a significant factor in reducing the grid contrast.

SUMMARY OF THE INVENTION

It is an object of this invention to provide an improved tagging magnetic resonance imaging method which allows for automatic detection of tagging patterns.

A magnetic resonance imaging method according to the present invention is characterized in that the pulse and gradient sequences are applied in pairs with spatially different tagging patterns, images corresponding to the pairs being subtracted so as to form a tagged image.

In such a method according to the present invention, by appropriate choice of the tagging patterns, the component of the image caused by the relaxed magnetization is eliminated and further, as a byproduct, untagged images are obtained by addition of the paired images. The high contrast images obtained allow for automatic grid pattern detection by searching for lines of minima within the tagged image.

In an embodiment of a magnetic resonance imaging method according to the present invention, the tagging patterns in the respective pairs are inverted with respect to each other. Optimum results are obtained with this choice of tagging patterns.

A further embodiment of a magnetic resonance imaging method according to the present invention is characterized in that the tagging section comprises a first and a second radio frequency pulse separated by a first magnetic field gradient pulse for applying spatial modulation to a component of magnetization perpendicular to the part to be imaged. In this embodiment, the present invention improves the tagging in the cited Axel article, the so-called SPAMM tagging section (a periodic SPAcial Modulation of Magnetization prior to imaging), so as to allow for automatic detection of tagging patterns. In this embodiment the SPAMM tagging section achieves a stripe-like tagging pattern.

A further embodiment of a magnetic resonance imaging method according to the present invention is characterized in that the tagging section further comprises a third and a fourth radio frequency pulse separated by a second magnetic field gradient pulse orthogonal to the first magnetic field gradient pulse. A grid-like tagging pattern is obtained in this embodiment.

A further embodiment of a magnetic resonance imaging method according to the present invention is characterized in that in the inverted tagging pattern one of the phases of the radio frequency pulses is in opposition to the phases of the other radio frequency pulses. This achieves optimum mode tagging patterns in SPAMM-like tagging sections.

A further advantageous embodiment of a magnetic resonance imaging method according to the present invention is characterized in that the radio frequency pulses are combined 180° pulses and that the modulus of the image is used for defining the tagging pattern. With this embodiment very sharp minima are obtained, and hence a good motion resolution. Furthermore, the tagging sequence can be kept relatively short, so that the contrast loss due to longitudinal relaxation is negligible.

A further embodiment of a magnetic resonance imaging method according to the present invention is characterized in that the part is a heart, that the tagging section is applied upon detection of the R-wave of the electrocardiogram of the heart, and that the slice selective imaging segments are temporally spaced over a cardiac cycle. The tagging magnetic resonance imaging method according to the present invention is particularly useful for monitoring motion in the heart. With this embodiment multi heart phase images are obtained in which the tagging pattern can be detected automatically by searching for lines of minima within the images. The tagging patterns hardly contain any anatomical contrast. By varying the interval between the R-wave and the application of the tagging section, images of different phases of the heart cycle are obtained. The later stages of the heart cycle are imaged with respect to the R-wave, the more important a good tagging pattern contrast becomes due to the ever present longitudinal relaxation.

BRIEF DESCRIPTION OF THE DRAWING

The features and advantages of the magnetic resonance imaging method according to the present invention will be more clearly apparent from the following detailed description, in conjunction with the accompanying drawing, wherein.

DESCRIPTION OF THE PREFERRED EMBODIMENT

Figure 1:
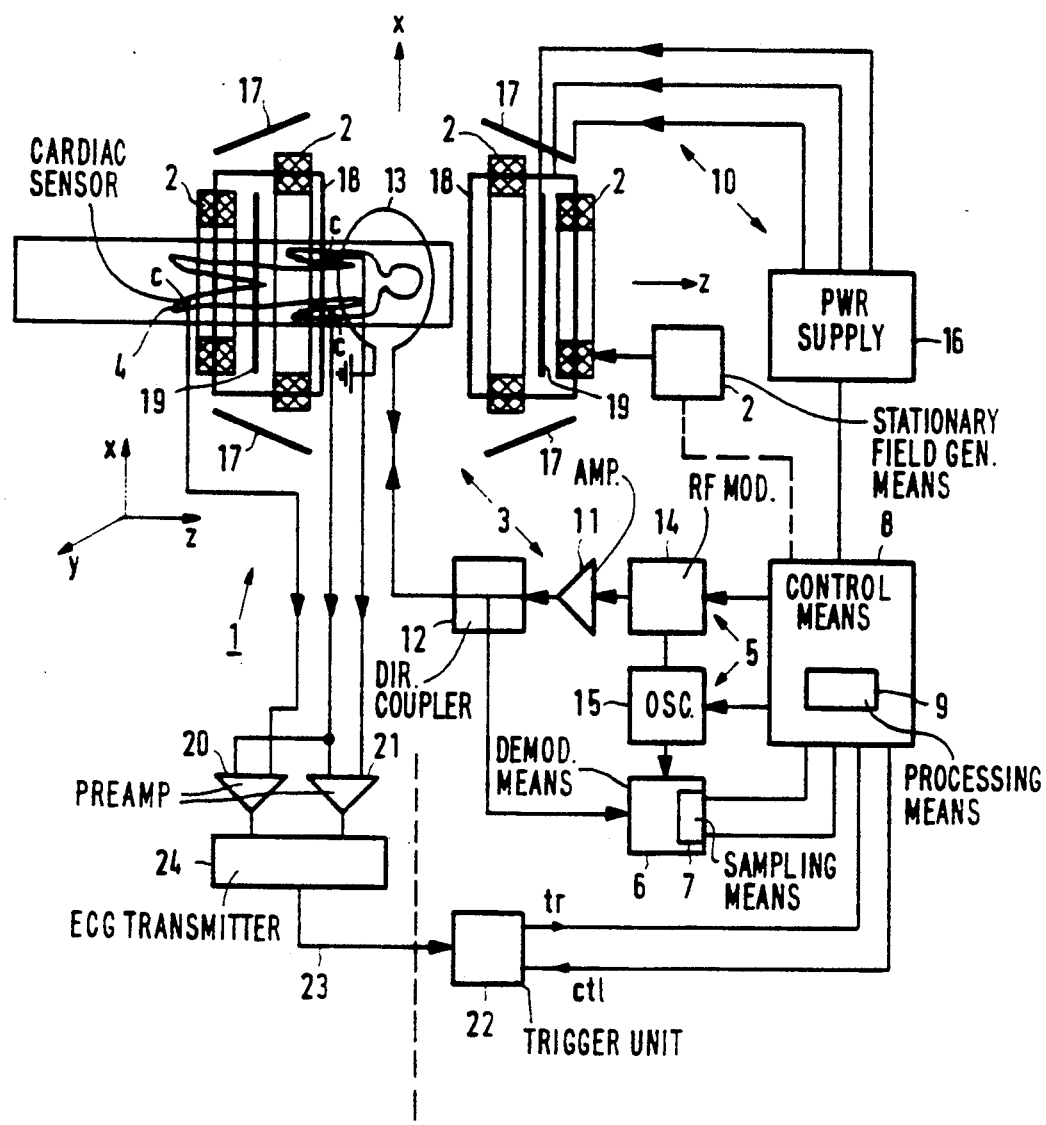
FIG. 1 shows, diagrammatically, a magnetic resonance imaging device according to the present invention.

FIG. 1 shows, diagrammatically a magnetic resonance device 1 according to the invention comprising a magnetic field generator 2 for generating a stationary homogeneous magnetic field, an RF radiator 3 for radiating radio frequency pulses to an object 4, a modulator 5 for modulating the rf-pulses, a receiver and demodulator 6 for receiving and demodulating excited magnetic resonance signals comprising a sampler 7 for sampling the magnetic resonance signals, and a controller 8 for controlling said RF radiator, modulator, receiver/-demodulator and sampler 3, 5, 6 and 7. The device 1 further comprises a processor 9 for processing the sampled magnetic resonance signals, and a gradient generator 10 for generating magnetic field gradients which are superimposed upon the stationary magnetic field. In further detail, the radiator 3 comprises the modulator 5, a power amplifier 11, a directional coupler and a transmitter and receiver coil 13. The modulator 5 comprises a modulator 14 and an oscillator 15. The modulation can be amplitude, frequency or phase modulation or a combination thereof, controlled by the controller 8. The radiator 3 excites nuclear spins in the object 4 when transmitting rf-pulses, and the receiver and demodulator 6 will receive magnetic resonance signals in response thereto. The transmission and reception may have various embodiments, e.g. the coil 13 may be a transmitter/receiver coil or may be embodied as separate transmitter and receiver coils. In the separate embodiment no directional coupler 12 will be present. The receiver and demodulator 6 may comprise a quadrature demodulator, in which case the sampler 7 will comprise two analog-to-digital convertors supplying quadrature detected samples of respective sin and cos components of the magnetic resonance signal. The gradient generator 10 comprises a power supply 16 controlled by the controller 8, for separate control of gradient magnetic coils 17, 18 and 19 which generate magnetic field gradients $G_x$, $G_y$, and $G_z$ respectively. The gradient coils 17, 18 and 19 may be arranged such that the field direction of the magnetic field gradients coincides with the direction of the stationary homogeneous magnetic field, and that the directions of the gradients are perpendicular to each other, indicated in FIG. 1 with mutually perpendicular axes x, y and z.

If the magnetic resonance device 1 is put into operation and the object 4 is placed inside the means 2 for generating the stationary field, a small excess of nuclear spins (of nuclei exhibiting a magnetic moment) will be directed in the direction of the stationary magnetic field, which can be considered macroscopically as a magnetization $M_0$, an equilibrium magnetization. The equilibrium magnetization $M_0$ can be disturbed by the application of pulse and gradient sequences to the object 4. For obtaining physiological information from the object 4, the magnetic resonance device 1 comprises several sensors, such as sensors c, for picking up cardiac signals which are fed to preamplifiers 20 and 21. The preamplified cardiac signals are fed to an ECG trigger unit 22 via a fibre optic cable 23 by means of an ECG transmitter 24. The ECG trigger unit 22 supplies trigger pulses tr to the controller 8 for triggering pulse and gradient sequences. The ECG trigger unit 22 is further controlled by the controller 8 by means of control signal ctl for inhibiting the ECG trigger unit 22 from sending pulses during predetermined periods. The processor 9 may comprise a programmer so that the pulse and gradient sequence starts from a predetermined time from the trigger pulse tr. The trigger pulse tr may be derived in the trigger unit 22 from the R-wave of the electrocardiagram obtained from the object 4. For a more detailed description of a MRI device and a general description of the principles of MRI, reference is made to the handbook, "Practical NMR Imaging", M.A. Foster and J.M.S. Hutchinson, 1987 IRL Press.

Figure 2A:
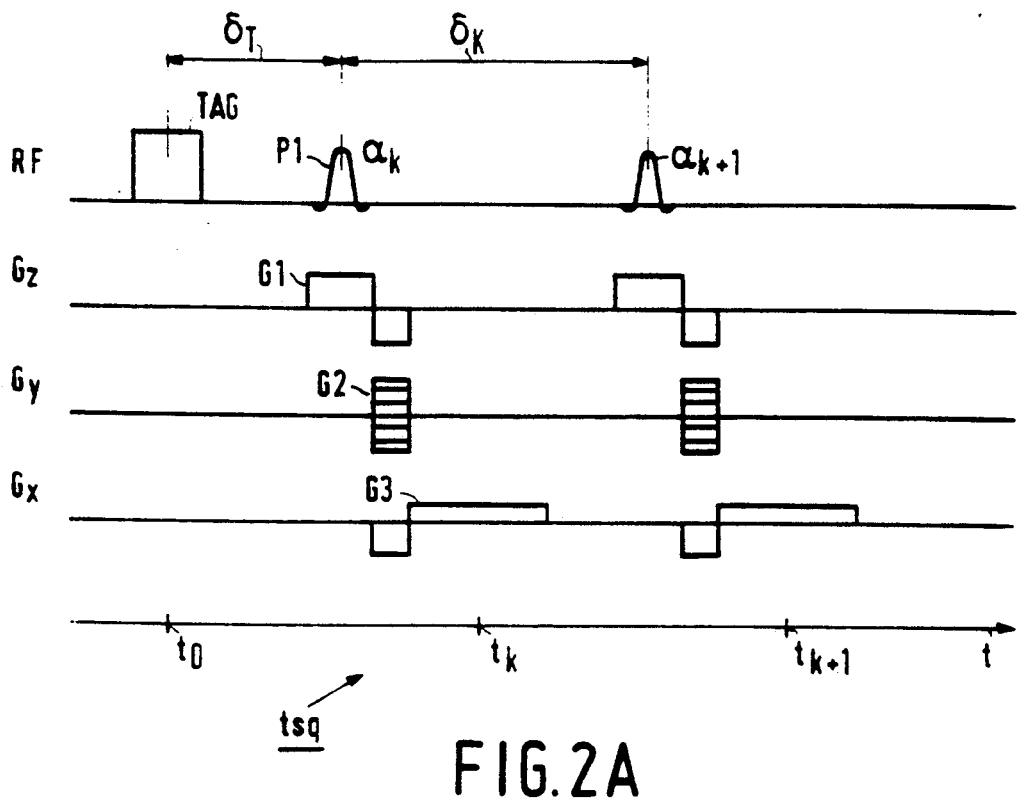
FIG. 2A shows a known multi heart phase myocardial tagging sequence.

In FIG. 2A, a known multi heart phase myocardial tagging sequence tsq is shown as a function of the time t. At $t=t_0$ a tagging section TAG is applied, e.g. a SPAMM tagging section as described in the cited Axel article. The tagging section is applied under the control of the controller 8 a predetermined time interval after the controller receives a trigger pulse tr from the trigger means 22. For obtaining a stripe-like tagging pattern, the tagging section comprises two radio frequency pulses separated by a "wrap" gradient. For obtaining a grid-like tagging pattern, the tagging section may comprise two such rf-pulse gradient combinations in succession. The two one dimensional tagging sections must be separated by so called spoiler or dephasing gradient, to obtain a multiplication of these two tagging patterns. The tagging section TAG is followed by a multi heart phase imaging section after a time interval $\delta_T$, the imaging section comprising a number of gradient echo imaging segments temporally spaced over the cardiac cycle. Each imaging segment comprises an rf-pulse P1 with excitation angle $\alpha$, a slice selection gradient G1, a phase encoding gradient G2 and a readout gradient G3 applied by the rf-coil 13 and the gradient coils 17, 18 and 19, respectively. The pulses $\alpha_k$, k=0,...,n−1 (n: total number of heart phase images), are low flip angle pulses, not necessarily all equal. The respective pulse angles can be optimized for particular repetition times and tissue longitudinal relaxation times. The sequence tsq is repeated a number of times, e.g. 256, for different values of the phase encoding gradient G2. The received and sampled magnetic resonance signals around $t=t_k$, $t=t_{k+1}$, ... are processed by the processor 9, a tagged image being obtained for each heart phase. The time interval between the kth and (k+1)th imaging segment is $\delta_k$.

Figure 2B:
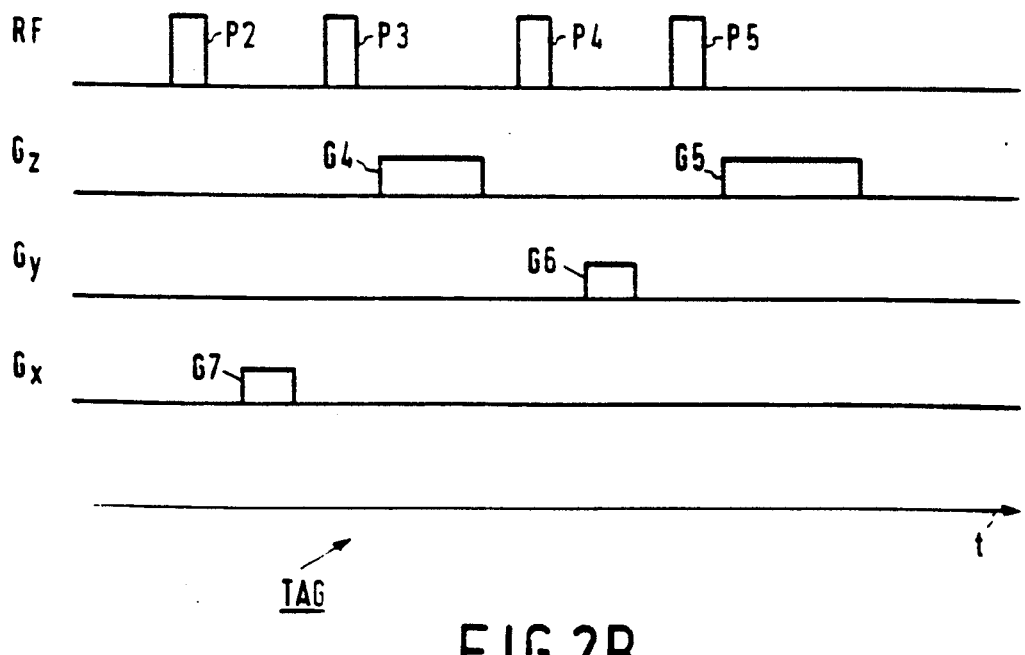
FIG. 2B shows a SPAMM tagging section for applying a grid-like tagging pattern.

In FIG. 2B, a SPAMM tagging section TAG for applying a grid like tagging pattern is shown, comprising first and second radio frequency pulses P2 and P3 separated by a first "wrap" gradient G7, and comprising third and fourth radio frequency pulses P4 and P5 separated by a second "wrap" gradient G6, the first and the second "wrap" gradient being orthogonal with respect to each other. The gradients G4 and G5, which must be in slice selection direction, are applied to dephase any x and y components of the tagging magnetization.

The spatial modulation can be described as $$TAG(x,y)=\cos(\beta x).\cos(\gamma y)$$

The factors $\beta$ and $\gamma$ are determined by the integrals of the gradients G7 and G6, respectively. The amplitudes of the pulses P2, P3, P4 and P5 can be constant. The radio frequency pulses P2 and P3, and P4 and P5 form so-called "11" sets of pulses then, the sum of the pulse angles of the pulses P2 and P3, and P3 and P4 being in a range of 90° and 180°. Binomial pulse combinations such as "121" or "1331" pulses can also be applied, separated by gradients. Practically, the summed angle amounts between 90° and 180°. For a specified tissue, a specified number of excitation pulses of a specified angle and for a specified time point, the tagging angle can be optimized to obtain a better contrast than a known SPAMM sequence. For example, when measuring a diastolic, a midstolic, and a systolic modulus image with an excitation angle of 35°, the tagging contrast at the systolic images on the myocardium is maximal, using a tagging angle of about 140°. The present invention overcomes such problems. Application of binomial pulse combinations might take too long, i.e. the tagging section might not be completed before the heart begins to move.

Before a more detailed description of the present invention will be given, shortcomings of the known SPAMM tagging will first be outlined. It is assumed for simplicity that the object 4 to be imaged has a uniform magnetization density equal to unity. Then, immediately after the TAG section, the z-magnetization is given by $$M_0.TAG(x,y)$$

The shape of each heart phase image is determined by the z magnetization immediately before the respective rf excitation pulses P1. For the first image this z-magnetization is $$1-(1-M_0.TAG(x,y)).\exp(-\delta T/T_1)=M_0.TAG(x,y).\exp(-\delta T/T_1)+(1-\exp(-\delta T/T_1))$$

where $T_1$ represents the longitudinal relaxation time.

In the above formula, the first term $$QT_0=M_0.TAG(x,y).\exp(-\delta T/T_1)$$

represents a decaying image of the object which has been modulated by the tagging pattern, and the second term, $$QR_0=1-\exp(=\delta T/T_1)$$

represents an image of the object due only to that magnetization that has been relaxed since the application of the tagging section TAG. For the kth heart phase image $$QT_k=QT_0.\pi_j\cos(\alpha_j).\exp(-\delta j/T_1), \text{ for } j=0 \text{ to } k-1$$

and, recursively, $$QR_{k+1}=1-(1-QR_k).\exp(-\delta k/T_1)$$

$QT_k$ contains the information for monitoring myocardial motion, while $QR_k$ is a term I which reduces the contrast of the tagging grid, and for a tagging section with a 90° tagging angle it can easily be shown that $$QT_k=\lambda k.(1-\cos(\beta x)).(1-\cos(\gamma y))$$

$\lambda k$ being dependent on the $\alpha j$'s, $\delta j$'s, $T_1$ etc., but not depending on the spatial coordinates x and y. In the presence of motion the variables x and y represent object coordinates at the point in time $t=t_0$ at which the tagging section TAG is applied. The tagged image is given by $$\lambda k.(1-\cos(\beta x)).(1-\cos(\gamma y))+QR_k$$

Basically the tagging grid can be automatically detected by searching for the lines of minima within the tagged image. However, due to the presence of the term $QR_k$ and the influence of $\lambda k$, the actual values of these minima vary widely. In an image with large intensity variations, which is usually the case, it could be very difficult to detect these minima.

For a tagging section with a 180° tagging angle, $$QT_k=k.\cos(\beta x).\cos(\gamma y)$$

And for modulus type images, as is dealt with in many cases, the image shape is as follows, $$|\lambda k.\cos(\beta x).\cos(\gamma y)+QR_k|$$

In the latter case it does not suffice to search for lines of minima, their position being influenced by λk and $QR_k$. The tagging grid, which is positioned between the lines of minima, can only be assigned definitely in homogeneous regions of the object in this case.

According to the present invention, the term $QR_k$, is eliminated in order to allow for reliable automatic detection of tagging grids in tagged images. The elimination is achieved by performing pairs of measurements with two spatially differing tagging functions and by subtracting the tagged images resulting from two tagging pulse and gradient sequences tsq with different tagging sections TAG incorporating these tagging functions. Denoting the respective tagging functions by TAG1(x,y) and TAG2(x,y), the best results are obtained when $$TAG1(x,y) = -TAG2(x,y)$$

For a 180° SPAMM tagging section TAG as shown in FIG. 2B $$TAG1(x,y) = \cos(\beta x).\cos(\gamma y)$$

This tagging pattern can inverted by negating the phase of any one of the four radio frequency pulses P2, P3, P4 or P5, i.e. by replacing one of the four 90° pulses in "11" sets of pulses P2, P3 and P4, P5 respectively by a −90° pulse. With this choice of tagging functions, the form of the tagged image is as follows $$|2\lambda k.\cos(\beta x).\cos(\gamma y)|$$

By addition of the two tagged images resulting from the two tagging sequences an image with $T_1$ dependent anatomical contrast will be obtained with the form of $$2 \cdot QR_k$$

According to the present invention, the lines of minima substantially have zero intensity, which make them very easy to detect. The zero intensity lines are detected automatically by means of the processor 9 through scanning of the resulting tagged image. Furthermore, the tagging magnetic resonance method according to the present invention gives very sharp minima when the tagging grid is defined as a modulus image.

In case of 90° tagging angles, according to the present invention, the tagging grid lines can be narrowed by applying binomial pulses, with a summed pulse angle of 90° for each tagging direction. The form of the tagging function then is, by rough approximation $$(1-\cos^n(\beta x)).(1-\cos^n(\gamma y))$$

n being the order of the binomial sequence. The duration of the tagging sequence increases with the order n and tagging might not be completed before the heart starts to move. In case of myocardial motion the 180° variant is thus preferred.

We claim:

1. A magnetic resonance imaging method for monitoring motion of a part of an object to be imaged comprising applying a plurality of pairs of pulse and gradient sequences with spatially different tagging patterns to the object, each of which sequences comprise a tagging section for producing a tagging pattern and an imaging section for producing magnetic resonance signals in the part of the object, the resonance signals being used for forming at least one image of the object for each of said pairs of pulse and gradient sequences, and subtracting images corresponding to the pairs so as to form a tagged image for monitoring the motion of the part.

2. A magnetic resonance imaging method as claimed in claim 1 including inverting the tagging patterns in one of the respective pairs with respect to the other to provide an inverted tagging pattern.

3. A magnetic resonance imaging method as claimed in claim 2 wherein the tagging section comprises a first and a second radio frequency pulse separated by a first magnetic field gradient pulse for applying spatial modulation to a component of magnetization perpendicular to the part to be imaged.

4. A magnetic resonance imaging method as claimed in claim 3 wherein the tagging section further comprises a third and a fourth radio frequency pulse separated by a second magnetic field gradient pulse orthogonal to the first magnetic field gradient pulse.

5. A magnetic resonance imaging method as claimed in claim 4, wherein the inverted tagging pattern of one of the phases of the radio frequency pulses is in opposition to the phases of the other radio frequency pulses.

6. A magnetic resonance imaging method as claimed in claim 4, wherein the radio frequency pulses are combined 180° pulses and the modulus of the image is used for defining the tagging pattern.

7. A magnetic resonance imaging method as claimed in claim 3, wherein the inverted tagging pattern of one phase of the radio frequency pulses is in opposition to the phases of the other radio frequency pulses.

8. A magnetic resonance imaging method as claimed in claim 3 wherein the radio frequency pulses are combined 180° pulses and that the modulus of the image is used for defining the tagging pattern.

9. A magnetic resonance imaging method as claimed in claim 1, further comprising detecting the tagging patterns by searching for lines of minima within the image.

10. A magnetic resonance imaging method as claimed in claim 1 wherein the imaging section comprises at least one slice selective imaging segment for obtaining at least one slice image of the part.

11. A magnetic resonance imaging method as claimed in claim 10, wherein the tagging section is applied upon detection of the R-wave of an electrocardiogram of a heart, and further comprising temporally spacing the slice selective imaging segments over a cardiac cycle.

12. A magnetic resonance imaging method as claimed in claim 1, wherein the tagging section comprises a first and a second radio frequency pulse separated by a first magnetic field gradient pulse for applying spatial modulation to a component of magnetization perpendicular to the part to be imaged.

13. A magnetic resonance imaging method as claimed in claim 12, wherein the tagging section further comprises a third and a fourth radio frequency pulse separated by a second magnetic field gradient pulse orthogonal to the first magnetic field gradient pulse.

14. A magnetic resonance imaging method as claimed in claim 13, including inverting the tagging patterns in the respective pairs with respect to each other wherein the inverted tagging pattern of one of the phases of the radio frequency pulses is in opposition to the phases of the other radio frequency pulses.

15. A magnetic resonance imaging method as claimed in claim 14, wherein the radio frequency pulses are combined 180° pulses and the modulus of the image is used for defining the tagging pattern.

16. A magnetic resonance imaging method as claimed in claim 15 further comprising detecting the tagging patterns by searching for lines of minima within the image.

17. A magnetic resonance imaging method as claimed in claim 16 wherein the imaging section comprises at least one slice selective imaging segment for obtaining at least one slice image of the part.

18. A magnetic resonance imaging method as claimed in claim 17 wherein the tagging section is applied upon detection of an R-wave of the electrocardiogram of a heart, and further comprising temporally spacing the slice selective imaging segments over a cardiac cycle.

19. A magnetic resonance imaging method as claimed in claim 13, wherein the radio frequency pulses are combined 180° pulses and the modulus of the image is used for defining the tagging pattern.

20. A magnetic resonance imaging method as claimed in claim 12, including inverting the tagging patterns in the respective pairs with respect to each other wherein the inverted tagging pattern of one of the phases of the radio frequency pulses is in opposition to the phases of the other radio frequency pulses.

21. A magnetic resonance imaging method as claimed in claim 20, wherein the radio frequency pulses are combined 180° pulses and the modulus of the image is used for defining the tagging pattern.

22. A magnetic resonance imaging method as claimed in claim 21 further comprising detecting the tagging patterns by searching for lines of minima within the image.

23. A magnetic resonance imaging method as claimed in claim 22 wherein the imaging section comprises at least one slice selective imaging segment for obtaining at least one slice image of the part.

24. A magnetic resonance imaging device for monitoring motion of a part of an object, comprising means for generating a stationary homogeneous magnetic field, means for radiating radio frequency pulses to the object which is located in the stationary field, gradient generating means for generating magnetic gradient fields which are superimposed upon the stationary field, processing means for applying pulse and gradient sequences to the object, the pulse and gradient sequences comprising a tagging section and an imaging section, and receiving means and sampling means for receiving and sampling magnetic resonance signals generated by the sequences in at least a part of the object, the processing means processing samples resonance signals, said processing means including means for applying the pulse and gradient sequences in pairs with spatially differing tagging patterns, for subtracting images corresponding to the pairs so as to form a tagged image, and for monitoring the motion in the part by scanning the tagging pattern in the tagged image.

* * * * *